United States Patent
Peter et al.

(10) Patent No.: US 11,169,584 B2
(45) Date of Patent: Nov. 9, 2021

(54) DUAL-CONNECTOR STORAGE SYSTEM AND METHOD FOR SIMULTANEOUSLY PROVIDING POWER AND MEMORY ACCESS TO A COMPUTING DEVICE

(71) Applicant: Western Digital Technologies, Inc., San Jose, CA (US)

(72) Inventors: Eldhose Peter, Bengaluru (IN); Akhilesh Yadav, Bengaluru (IN); Rakesh Balakrishnan, Bengaluru (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/836,424

(22) Filed: Mar. 31, 2020

(65) Prior Publication Data

US 2021/0303047 A1  Sep. 30, 2021

(51) Int. Cl.
*G06F 1/26* (2006.01)
*H01R 13/66* (2006.01)
*G11C 7/10* (2006.01)

(52) U.S. Cl.
CPC ............... *G06F 1/266* (2013.01); *G11C 7/10* (2013.01); *H01R 13/6675* (2013.01); *G06F 2213/0042* (2013.01)

(58) Field of Classification Search
CPC ... G06F 1/28; G06F 1/26; G06F 1/263; G06F 1/266
USPC .................................. 307/110, 19; 710/313
See application file for complete search history.

(56) References Cited

U.S. PATENT DOCUMENTS

| | | | |
|---|---|---|---|
| 7,028,126 B1 * | 4/2006 | Liang ................. | G06F 13/4068 710/301 |
| 7,177,953 B1 * | 2/2007 | Jackson ................. | H04L 12/10 249/216 |
| 7,447,922 B1 * | 11/2008 | Asbury ................. | G06F 1/266 710/303 |
| 9,780,783 B1 * | 10/2017 | Srivastava ......... | G06F 13/4086 |
| 2005/0170699 A1 * | 8/2005 | Overtoom ............ | H01R 31/065 439/639 |
| 2006/0065743 A1 | 3/2006 | Fruhauf | |
| 2006/0145666 A1 * | 7/2006 | Liu ..................... | H02J 2207/40 320/138 |

(Continued)

FOREIGN PATENT DOCUMENTS

KR  10-2007-0032844 A  3/2007
KR  10-2015-0089652 A  8/2015

OTHER PUBLICATIONS

International Search Report dated Dec. 21, 2020 for International Application No. PCT/US2020/038147.

(Continued)

*Primary Examiner* — Faisal M Zaman
(74) *Attorney, Agent, or Firm* — Crowell & Moring LLP

(57) ABSTRACT

A dual-connector storage system and method for simultaneously providing power and memory access to a computing device are provided. In one embodiment, the storage system comprises a memory, a first connector, a second connector, and a controller. The controller is configured to provide power received from the second connector to a computing device connected with the first connector while also allowing the computing device to access the memory via the first connector. Other embodiments are provided.

20 Claims, 9 Drawing Sheets

(56) References Cited

U.S. PATENT DOCUMENTS

| | | | | |
|---|---|---|---|---|
| 2009/0182935 | A1* | 7/2009 | Pizzarulli | G06F 13/4282 711/103 |
| 2009/0300239 | A1* | 12/2009 | Hubo | G06F 13/426 710/63 |
| 2013/0027868 | A1 | 1/2013 | Villa-Real | |
| 2013/0167226 | A1* | 6/2013 | Lin | H04M 1/0256 726/19 |
| 2016/0004650 | A1* | 1/2016 | Yamasaki | G06F 1/266 710/63 |
| 2016/0087474 | A1* | 3/2016 | Tallada | H02J 7/342 320/103 |
| 2016/0216750 | A1* | 7/2016 | Hundal | G06F 13/4068 |
| 2016/0321195 | A1* | 11/2016 | Ghosh | G06F 13/4282 |
| 2017/0005509 | A1* | 1/2017 | Saloranta | H02J 9/005 |
| 2017/0033513 | A1 | 2/2017 | Bae et al. | |
| 2017/0064006 | A1* | 3/2017 | Xue | H04L 67/141 |
| 2017/0202036 | A1* | 7/2017 | Ko | H04W 8/005 |
| 2017/0255585 | A1* | 9/2017 | Zhang | G06F 13/4286 |
| 2018/0046236 | A1* | 2/2018 | Erturk | G06F 1/26 |
| 2018/0052799 | A1* | 2/2018 | Shetty | G06F 13/4282 |
| 2018/0341310 | A1* | 11/2018 | Lambert | G06F 1/266 |
| 2019/0157888 | A1* | 5/2019 | Li | H02J 7/0044 |
| 2020/0151129 | A1* | 5/2020 | Wright | G06F 13/385 |

OTHER PUBLICATIONS

Written Opinion dated Dec. 21, 2020 for International Application No. PCT/US2020/038147.

Johnson, Dave; "'What is an Amazon Fire TV Stick?': Amazon's portable but powerful streaming device, explained"; Business Insider; Nov. 27, 2019; downloaded from the Internet at https://www.businessinsider.com/what-is-amazon-fire-stick on Mar. 22, 2020; 10 pages.

Micro USB HUB Adaptor with Power, TUSITA 3-Port Charging OTG Host Cable Cord Adaptor for Raspberry i 2 3 Pi Zero Android Smart Phone Tablet Samsung Galaxy HTC Sony Google G/Linux; Amazon.com product page; downloaded from the Internet at https://www.amazon.com/TUSITA-Adaptor-Charging-Adapter-Raspberry/dp/B00LTHBCN on Feb. 4, 2020; 10 pages.

Ultra Dual Drive USB 3.0 from SanDisk; Western Digital Store product page; downloaded from the Internet at https://shop.westerndigital.com/products/usb-flash-drives/sandisk-ultra-dual-drive-30-usb-3-0-micro-usb#SDDD2-016G-A46 on Mar. 17, 2020; 4 pages.

* cited by examiner

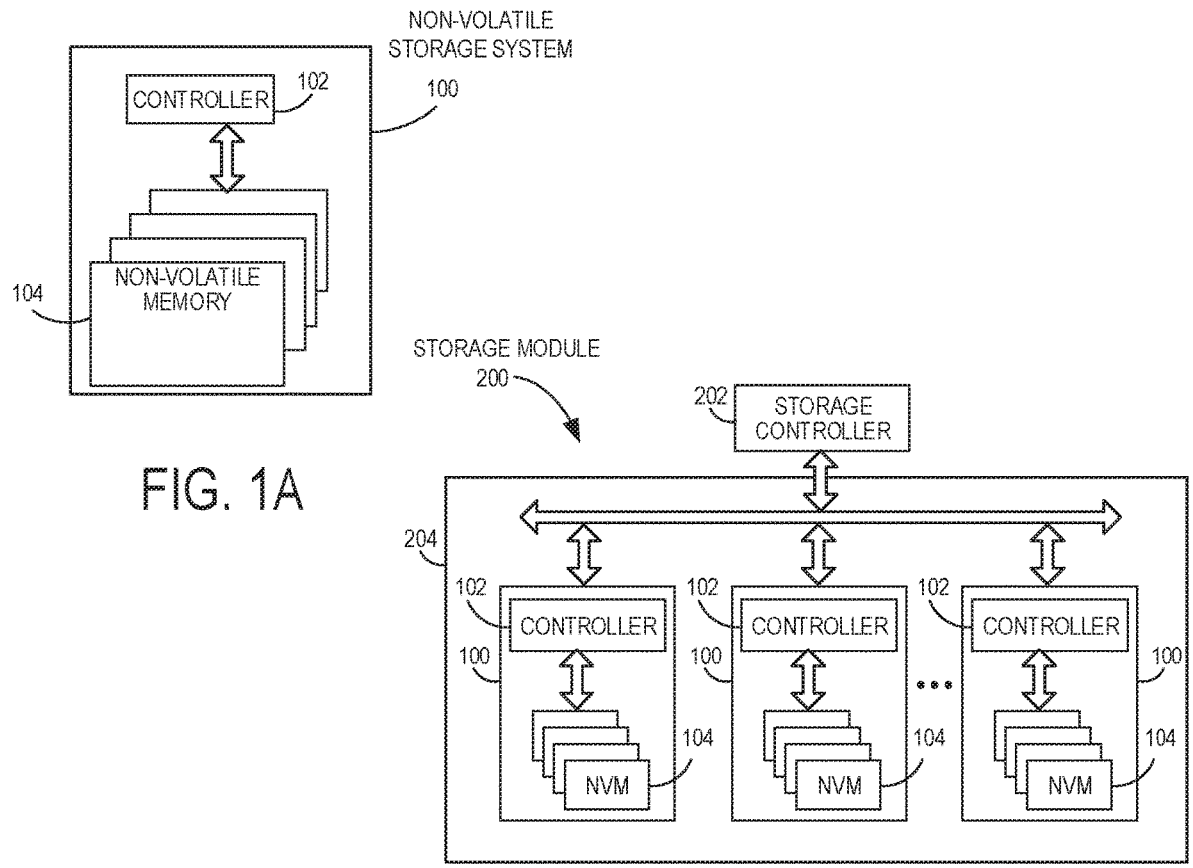
FIG. 1A
FIG. 1B
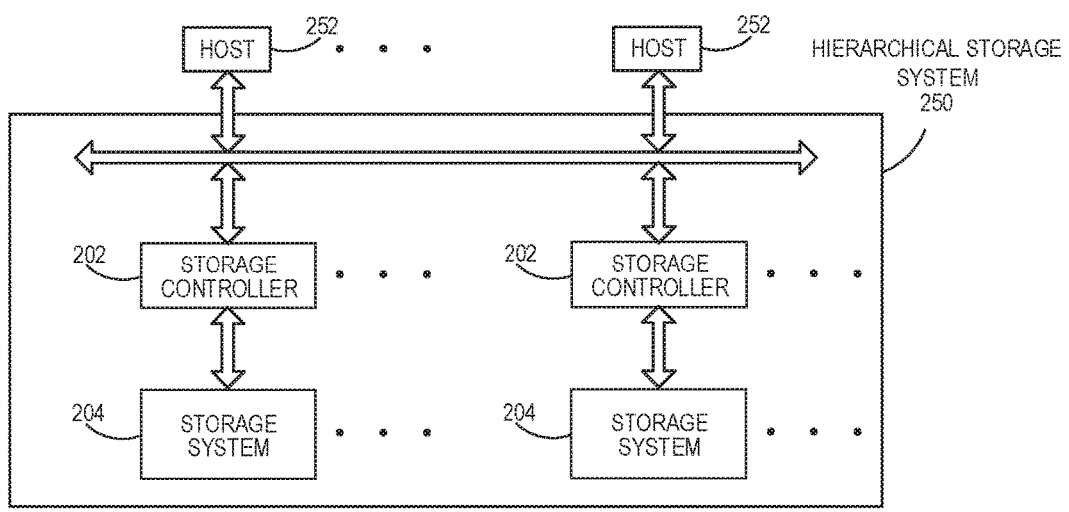
FIG. 1C

| A1 | A2 | A13 | A4 | A5 | A6 | A7 | A8 | A9 | A10 | A11 | A12 |
|---|---|---|---|---|---|---|---|---|---|---|---|
| GND | TX1+ | TX1- | VBUS | CC1 | D+ | D- | SBU1 | VBUS | RX2- | RX2+ | GND |
| GND | RX1+ | RX1- | VBUS | SBU2 | D- | D+ | CC2 | VBUS | TX2- | TX2+ | GND |
| B12 | B11 | B10 | B9 | B8 | B7 | B6 | B5 | B4 | B3 | B2 | B1 |

US 11,169,584 B2

DUAL-CONNECTOR STORAGE SYSTEM AND METHOD FOR SIMULTANEOUSLY PROVIDING POWER AND MEMORY ACCESS TO A COMPUTING DEVICE

BACKGROUND

Dual-connector storage systems can be used as on-the-go (OTG) storage for computing devices, such as mobile phones, tablets, and personal computers. Different computing devices can have different types of connectors (e.g., a universal serial bus (USB) connector or a micro USB connector). By having both types of connectors on the storage system, the storage system can be used with a wide variety of computing devices.

BRIEF DESCRIPTION OF THE DRAWINGS

FIG. 1A is a block diagram of a non-volatile storage system of an embodiment.

FIG. 1B is a block diagram illustrating a storage module of an embodiment.

FIG. 1C is a block diagram illustrating a hierarchical storage system of an embodiment.

DETAILED DESCRIPTION

Overview

Figure 2A:
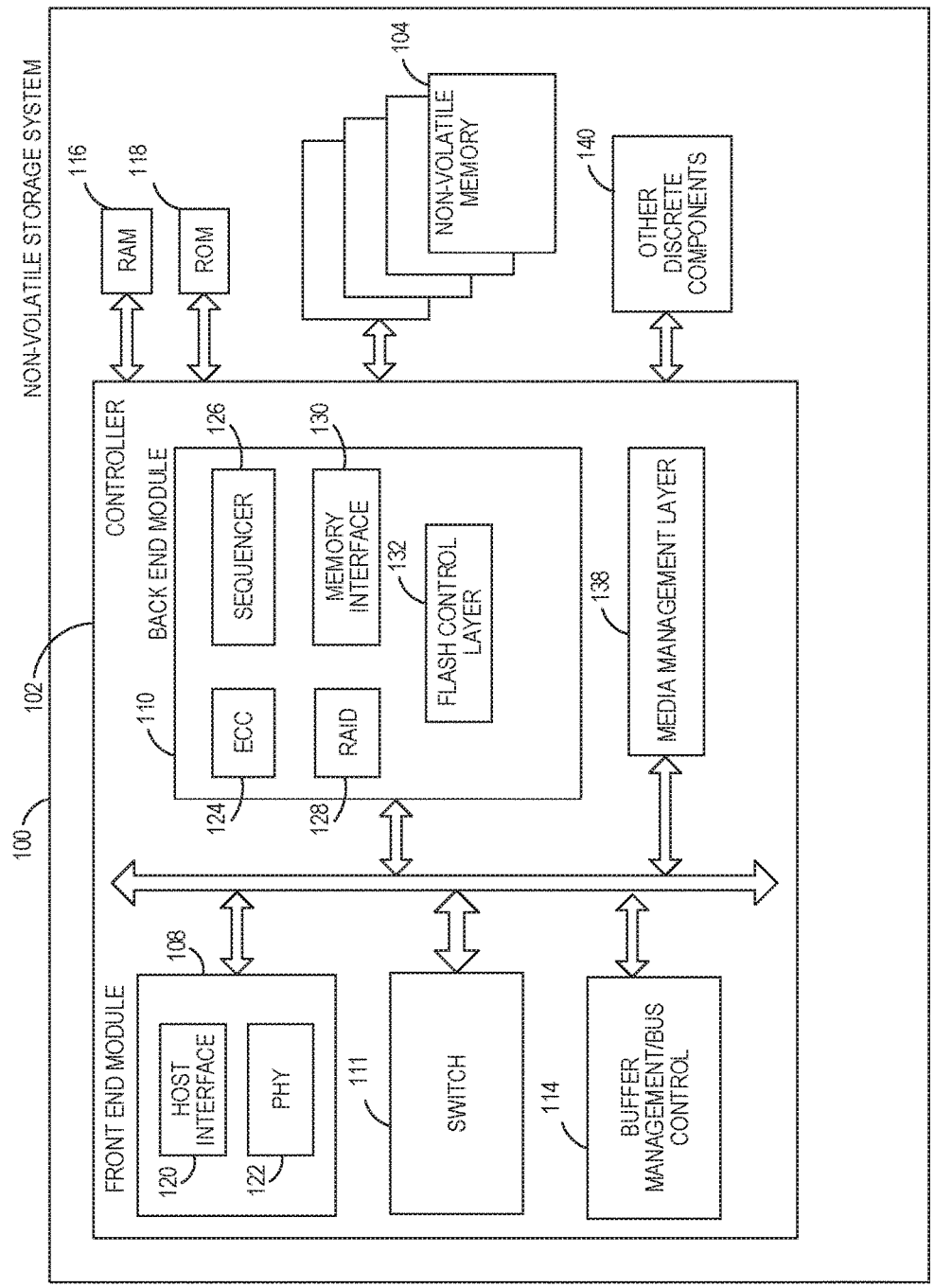
FIG. 2A is a block diagram illustrating components of the controller of the non-volatile storage system illustrated in FIG. 1A according to an embodiment.

By way of introduction, the below embodiments relate to a dual-connector storage system and method for simultaneously providing power and memory access to a computing device. In one embodiment, a storage system is provided comprising a memory, a first connector, a second connector, and a controller. The controller is configured to provide power received from the second connector to a computing device connected with the first connector while also allowing the computing device to access the memory via the first connector.

In some embodiments, the controller is further configured to represent the storage system as a host to the computing device when the first connector is connected with the computing device.

In some embodiments, the first connector is a micro universal serial bus connector, and wherein the controller is further configured to represent the storage system as the host to the computing device by grounding an identification (ID) pin of the first connector.

In some embodiments, the first connector is a Type-C universal serial bus connector, and wherein the controller is further configured to represent the storage system as the host to the computing device by switching channel configuration (CC) pins of the first connector to high through a pull-up resistor (Rp).

In some embodiments, the controller is further configured to instruct the computing device to take over as the host to allow the computing device to access the memory.

In some embodiments, the computing device takes over as the host using a host negotiation protocol.

In some embodiments, the memory comprises a three-dimensional memory.

In some embodiments, the first connector is configured to be removably connected with the computing device, and wherein the second connector is configured to be removable connected with a power source.

In some embodiments, one of the first connector and the second connector is a universal serial bus connector, and wherein the other of the first connector and the second connector is a micro universal serial bus connector.

In another embodiment, a method is provided that is performed in a storage system comprising a memory, a first connector, and a second connector. The method comprises instructing a computing device connected to the storage system via the first connector that the storage system is a host; providing power received via the second connector to the computing device via the first connector: instructing the computing device to take over as the host; and allowing the computing device to access the memory via the first connector while still providing the computing device with power via the first connector.

In some embodiments, the first connector is a micro universal serial bus connector, and wherein the storage system instructs the computing device that the storage system is the host by grounding an identification (ID) pin of the first connector.

In some embodiments, the first connector is a Type-C universal serial bus connector, and wherein the storage system instructs the computing device that the storage system is the host by switching channel configuration (CC) pins of the first connector to high through a pull-up resistor (Rp).

In some embodiments, the computing device takes over as the host using a host negotiation protocol.

In some embodiments, the memory comprises a three-dimensional memory.

In some embodiments, the first connector is configured to be removably connected with the computing device, and wherein the second connector is configured to be removable connected with a power source.

In another embodiment, a storage system is provided comprising a memory, a first connector, a second connector, and means for providing power from a power source connected with the second connector to a computing device connected with the first connector while also allowing the computing device to access the memory via the first connector.

In some embodiments, the first connector is a micro universal serial bus connector, and wherein the storage system further comprises means for representing the storage system as a host to the computing device by grounding an identification (ID) pin of the first connector in response to determining that the second connector is connected to the power source.

In some embodiments, the first connector is a Type-C universal serial bus connector, and wherein the storage system further comprises means for representing the storage system as the host to the computing device by switching channel configuration (CC) pins of the first connector to high through a pull-up resistor (Rp) in response to determining that the second connector is connected to the power source.

In some embodiments, the controller is further configured to instruct the computing device to take over as a host using a host negotiation protocol.

In some embodiments, the first connector is configured to be removably connected with the computing device, and wherein the second connector is configured to be removable connected with a power source.

Other embodiments are possible, and each of the embodiments can be used alone or together in combination. Accordingly, various embodiments will now be described with reference to the attached drawings.

EMBODIMENTS

Storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a computing device (e.g., host system) and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. In this embodiment, the controller 102 comprises a switch 111, which is discussed in more detail below, and can be implemented in hardware or software/firmware.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
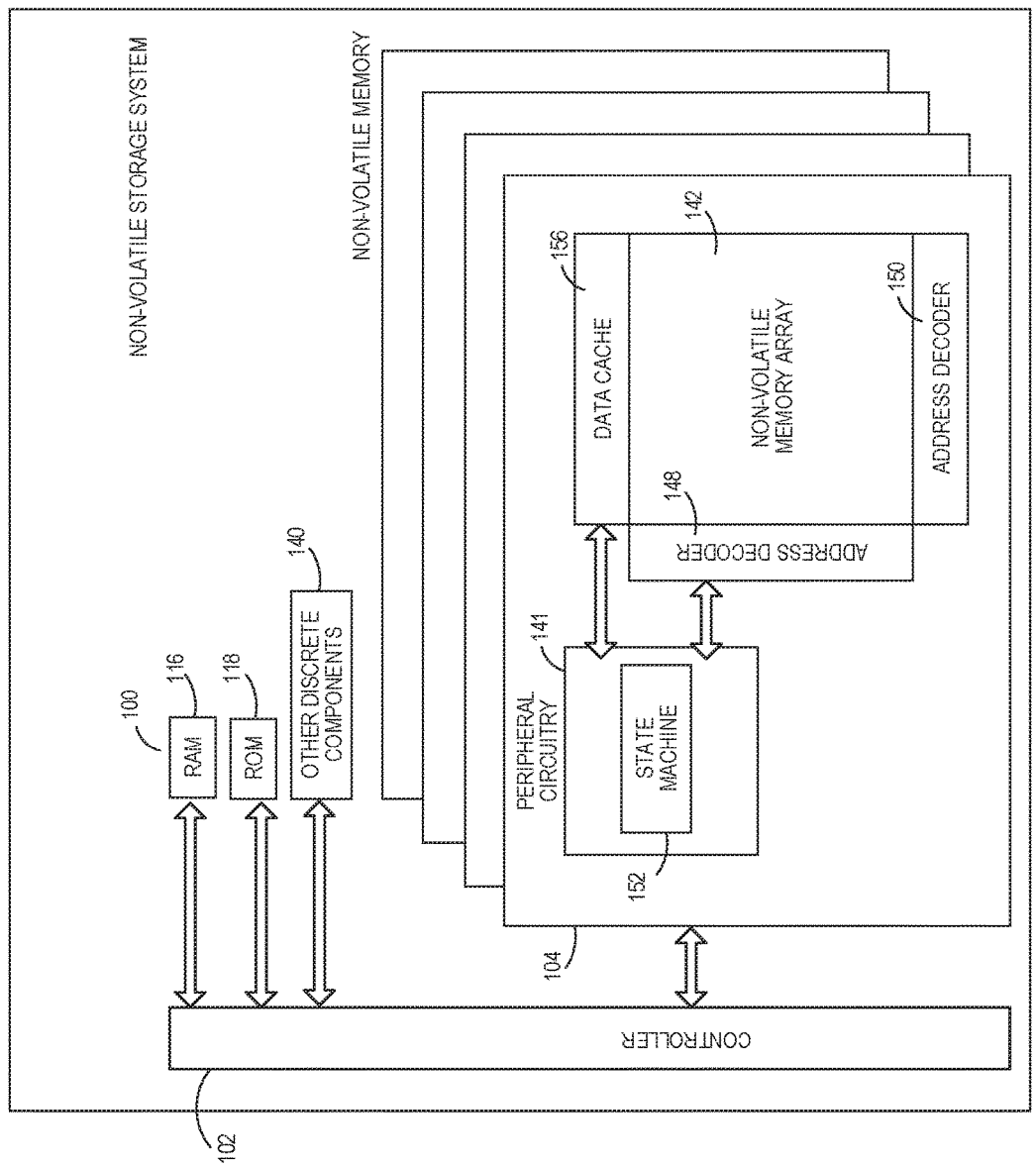
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
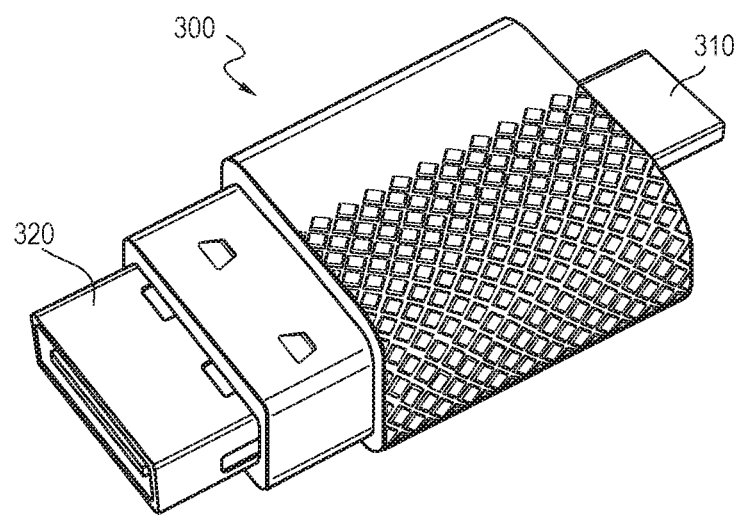
FIG. 3 is an illustration of a storage system of an embodiment.

Turning again to the drawings, FIG. 3 is an illustration of a storage system 300 of an embodiment. The internal components of the storage system 300 can be the same as or similar to the components discussed above. As shown in FIG. 3, the storage system 300 of this embodiment is a dual-connector storage system that a first connector 310 and a second connector 320. In this embodiment, these two connectors 310, 320, which are of different sizes, allow the memory 104 of the storage system 300 to be used with computing devices (e.g., mobile phones, tablets, laptop computers, set-tops boxes, etc.) having different mating receptacle. For example, in the illustration of FIG. 3, the first connector 310 takes the form of a micro universal serial bus (USB) connector which can be plugged into a wide variety of mobile phones and tablets, and the second connector 320 takes the form of a Type-C USB connector which can be used with a wide variety of desktop and laptop computers. So, by having two connectors 310, 320, the storage system 300 in this example can be used either with mobiles phones/tablets or with desktop/laptop computers. This avoids a user having to carry two different types of single-connector storage systems.

It should be noted that the storage system 300 in FIG. 3 is merely an example, and other embodiments can use different types of connectors. Further, while two different types of connectors are shown in the example in FIG. 3, it should be understood that both of the connectors can be of the same size and that the storage system can have more than two connectors. Additionally, while the connectors 310, 320 in the example of FIG. 3 are both male, one or both of the connectors can be female. Also, the terms connector, plug, port, and receptacle may be used interchangeably herein.

Figure 4:
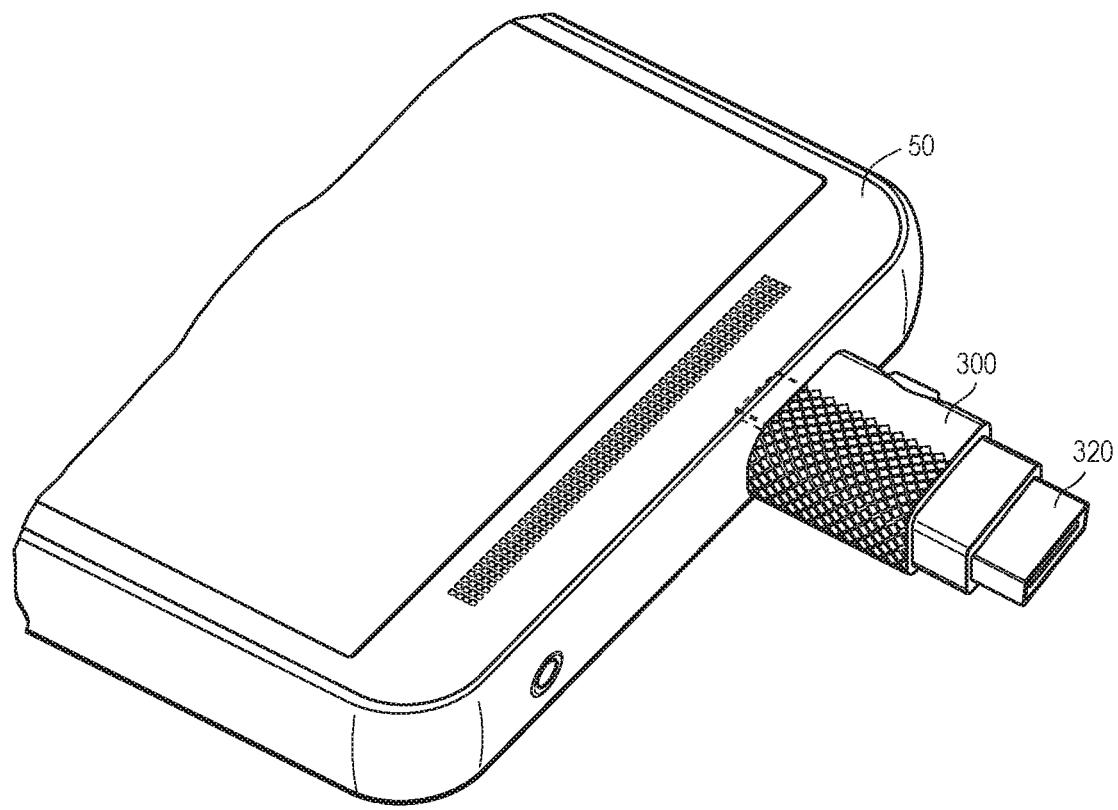
FIG. 4 is an illustration of a storage system of an embodiment connected with a computing device.

FIG. 4 shows the storage systems 300 connected to a computing device 50 (here, a mobile phone) via the first connector 310. After the storage system 300 is plugged in to the computing device 50, a processor in the computing device 50 can send read/write requests to the storage system 300 to access the storage system's memory 104. In this way, the storage system 300 can be considered an "on-the-go" (OTG) storage system. If the computing device 50 only has a single port, which is common in mobile phones and tables, a charging cord cannot be plugged into the computing device 50 if the storage system 100 is plugged into the computing device 50. Because this single port is shared between OTG storage and charging, a user would need to make the choice between using the storage system 100 for data transfer and charging the computing device. This can be especially problematic when a user is travelling, as he cannot charge his computing device while watching a movie stored in the storage system. If the computing device's battery is running low, the user would need to remove the OTG drive and connect a charging cable for charging. This limits the use of the OTG drive. This dilemma is also present with other wired accessories, such as headphones or a keyboard.

Figure 5:
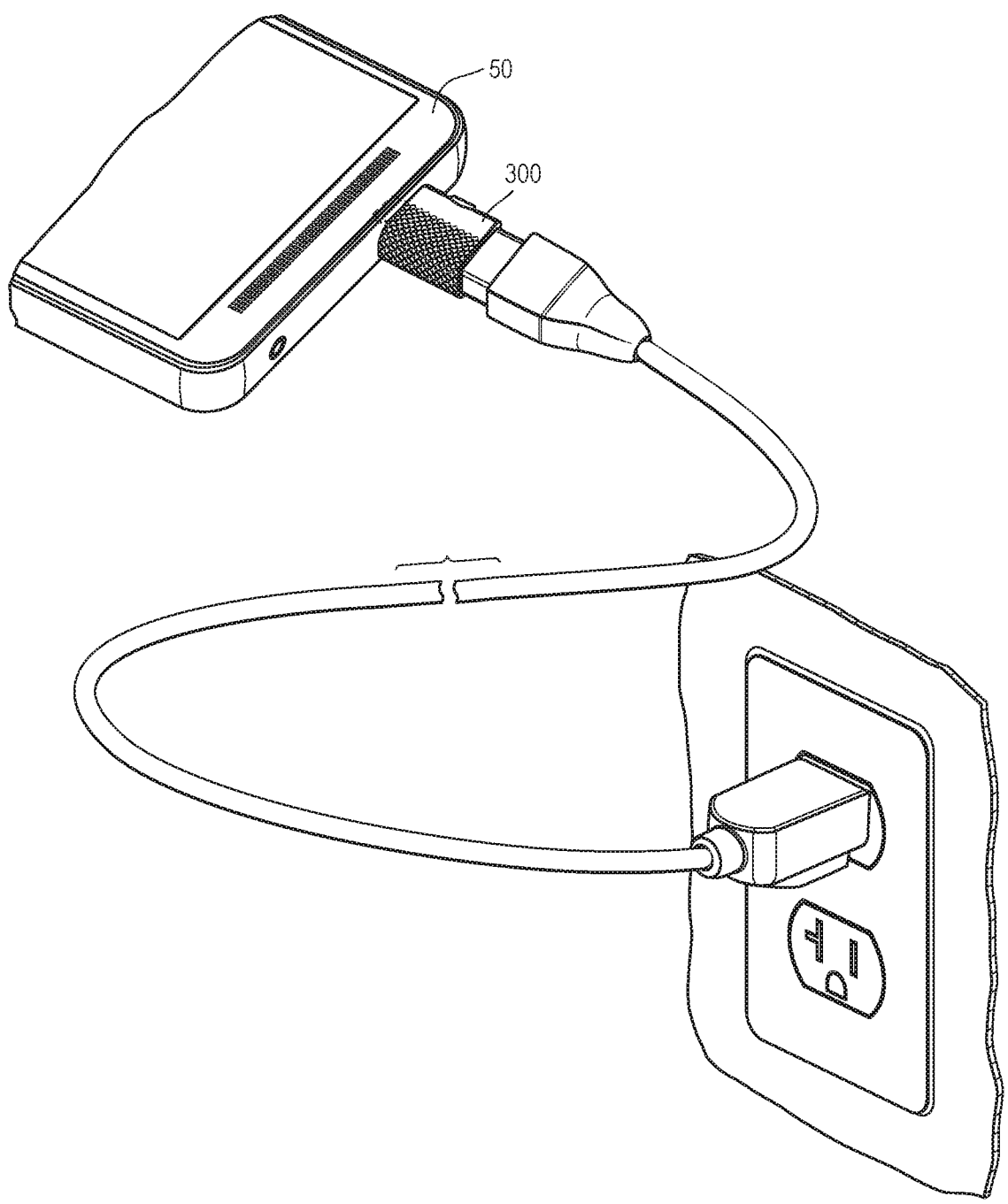
FIG. 5 is an illustration of a storage system of an embodiment connected with a computing device and a power cord.

As also shown in FIG. 4, after the storage system 300 is plugged into the computing device 50, the unused connector (here, the second connector 320) is not utilized. In one embodiment, the storage system 300 takes advantage of the unused connector to solve the problem noted above. Specifically, as shown in FIG. 5, the unused connector is plugged into a power cord that can be plugged into a power source (e.g., an electrical outlet, a battery, another computing device, or any other device that provides power). That way, if the storage system 300 determines that the second connector 320 is receiving power, the storage system 300 can provide power (with the storage system 300 merely acting as a pass through or possibly consuming some of the power itself) to the computing device 50 connected with the first connector 310 while also allowing the computing device 50 to access the memory 104 in the storage system 300. As conventional storage systems do not allow the storage system to simultaneously provide power and memory access in this way, the following paragraphs provide several example implementations to achieve this simultaneous use. It should be noted that these implementations are merely examples and other implementation can be used.

Figure 6:
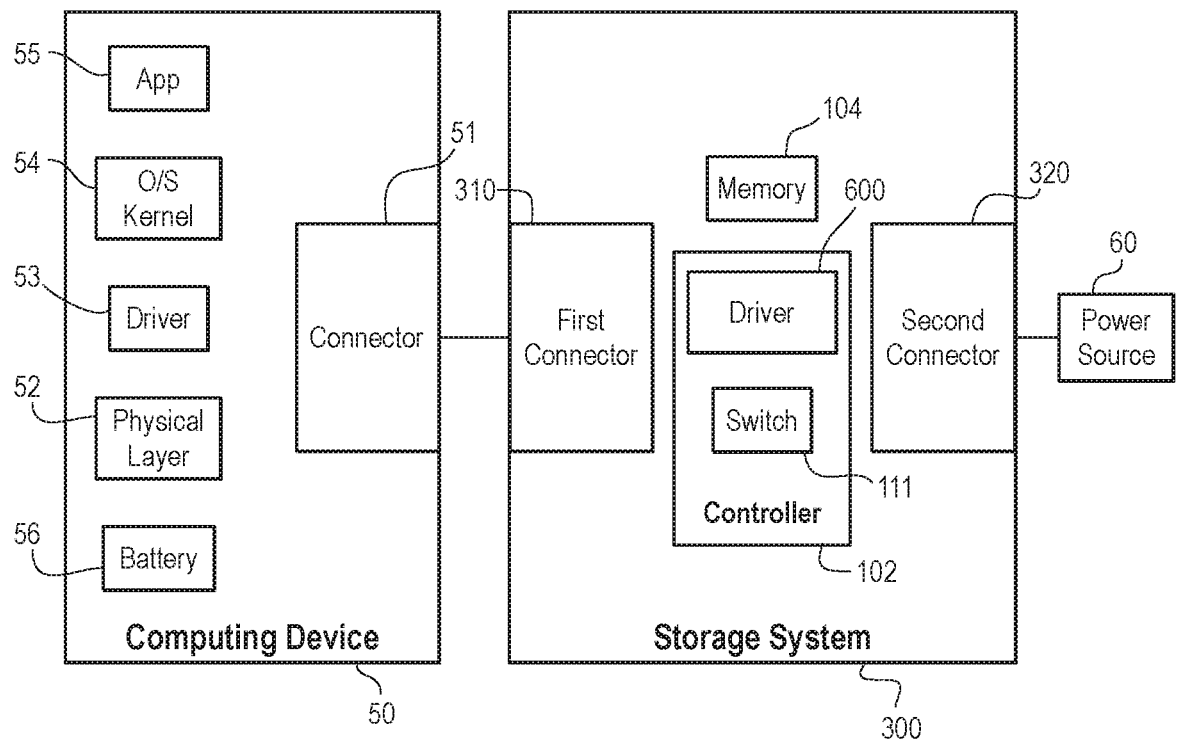
FIG. 6 is a block diagram of a computing device and storage system of an embodiment.

Returning to the drawings, FIG. 6 is an illustration of some of the components of the computer device 50 and storage system 300 in this example. As shown in FIG. 6, the host 50 comprises a connector 51 that mates with the first connector 310 of the storage system 100. The computing device 50 also comprises a physical layer 52, a driver 53, an operating system kernel 54, an app 55 (which can be computer-readable program code executed on a processor in the computing device 50), and a battery 56. In one embodiment, the app 55 is provided by the storage system's manufacturer to allow the computing device 50 to take advantage of the functionality described herein. The computing device 50 can comprise additional components, which are not shown in FIG. 6 for simplicity. The storage system 300 in this example comprises the first and second connectors 310, 320, memory 104 and a controller 102, which can comprise a switch 111 and a driver 600.

In this example, the switch 111 is used to inform the computing device 50 what role the storage system 100 is taking with respect to the computing device 50. Typically, when a storage system is connected to a computing device, the storage system takes the role of a peripheral, and the computing device takes the role of the host. In this arrangement, the host (computing device) issues read/write commands to the peripheral (slave storage system). In contrast, when the computing device is plugged into a power source or a personal computer, the computing device takes the role of the peripheral, and the power source takes the role of the host.

In this embodiment, the switch 111 in the storage system 300 makes the computing device 50 think it is being connected to a power source 60, so the computing device 50 will take the role of a peripheral, and the storage system 300 will take the role of a host, which results in the computing device 50 being charged via the storage system 300. As a peripheral, the computing device 50 is unable to access the memory 104 of the storage system 300. To change this, the storage system 300 instructs the computing device 50 to take over the role as the host (but the storage system 300 would continue to supply power (e.g., on the VBUS)). In this way, the storage system 300 can simultaneously power and provide memory access to the computing device 50. These functions can be performed in any suitable way, and the following paragraphs provide some sample implementations.

Figure 7:
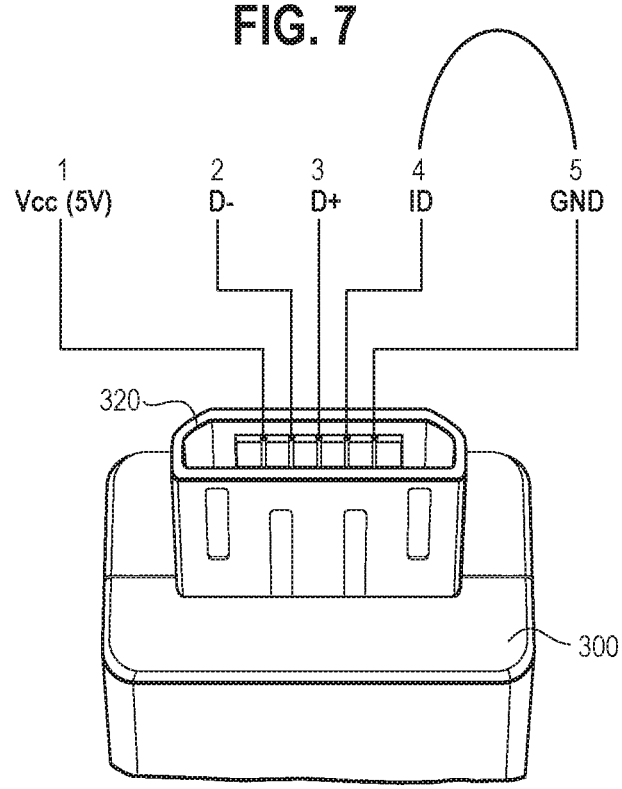
FIG. 7 is an illustration of a connector of a storage system of an embodiment.

In one embodiment, the switch 111 detects that the storage system 100 is receiving power via the second connector 320 and reconfigures the output of the pins of the first connector 310 to cause the computing device 50 to think it is being plugged into a power source instead of to a storage system. For example, as shown in FIG. 7, if the first connector 310 is a micro USB connector, and the switch 111 can ground an identification (ID) pin, which will make the computing device 50 assume the role of a peripheral. That is, in a micro USB connector, pin 4 (ID pin) is used to select host or peripheral functionality. With the ID pin at ground (GND), the storage system 300 functions as a USB host (A-Device) and provides VBUS to the attached USB peripheral. Otherwise, the storage system 300 functions as a USB peripheral. This embodiment uses the same ID pin for simultaneously providing power and memory access.

Figures 8A, 8B:
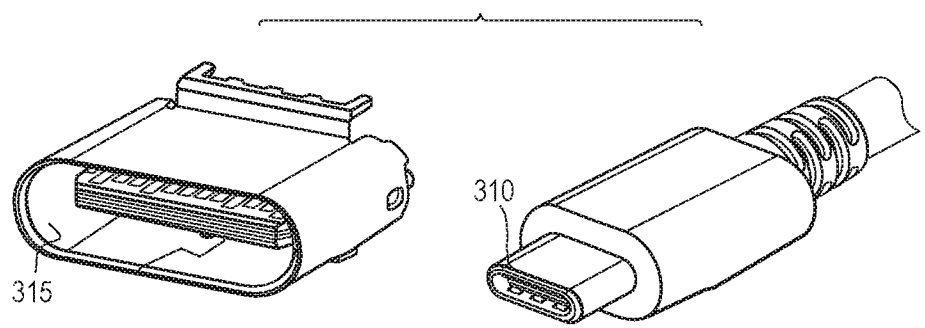
FIG. 8A is an illustration of connectors of a computing device and a storage system of an embodiment.
FIG. 8B is an illustration of a pin map of a connector of a computing device of an embodiment.
Figure 9:
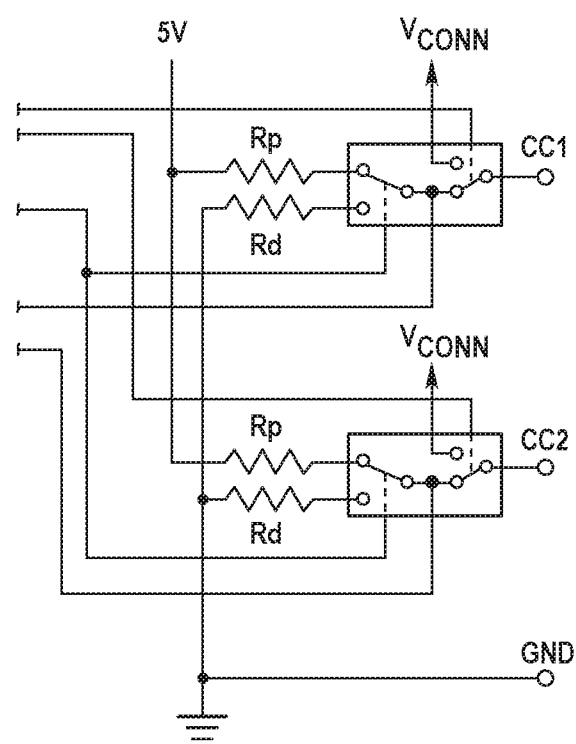
FIG. 9 is an illustration of an embodiment for representing a storage system as a host to a computing device.

As another example, consider the situation (shown in FIG. 8A) in which the first connector 310 takes the form of a Type-C USB connector and the connector 51 in the computing device 50 takes the form of a Type-C USB receptacle 315. FIG. 8B shows the pin map of the receptacle 315. In a Type-C USB connector, the receptacle ID pin is absent. So, as shown in FIG. 9, in this example, the switch 111 can switch channel configuration (CC) pins of the first connector to high through a pull-up resistor (Rp) in response to determining that the second connector is connected to the power source 60. That is, in this example, the host or peripheral detection is done through the monitoring channel configuration (CC) pins (CC1/CC2) while toggling at a specific interval between a pull-up resistor and pull-down resistor. Depending on the voltage level detected on the CC pins after a defined de-bounce time, the storage system 300 becomes either a host or a peripheral. In the Type-C ecosystem, the USB 2.0 OTG device is referred as a dual-role port (DRP). A DRP is a device that can function either as a USB host or as a USB peripheral. In Type-C terminology, a USB host (A-Device) is called a downstream-facing port (DFP), and a USB peripheral is called an upstream-facing port (UFP). When a connection occurs because an Rp is selected for the CC pin in the above connection, the DRP device behaves as a DFP (host) and provides VBUS to the attached peripheral.

Figure 10:
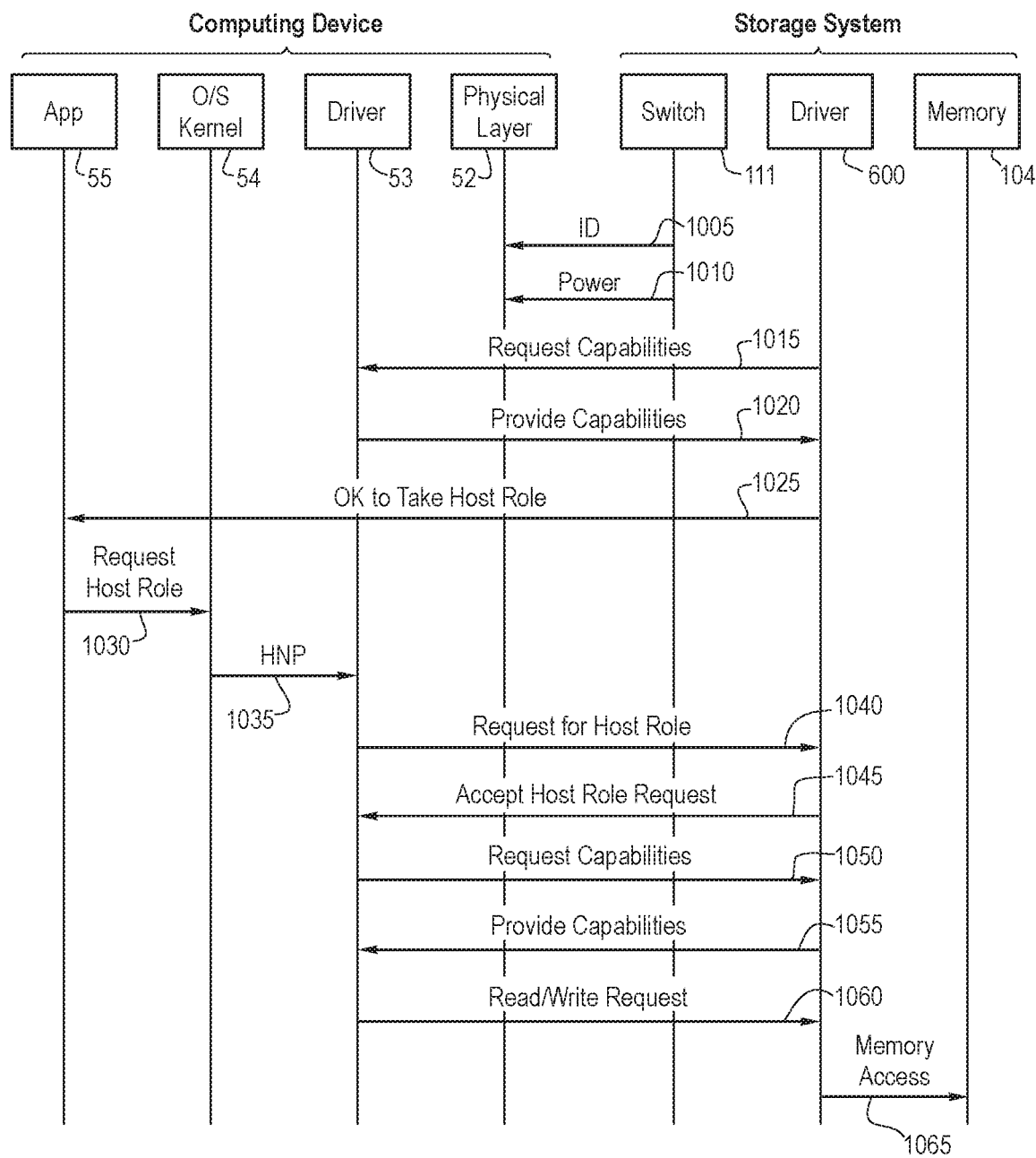
FIG. 10 is a flow diagram of a method of an embodiment for simultaneously providing power and memory access to a computing device.

With the computing device 50 acting as a peripheral, it can be charged from the power source 60 via the host storage system 300. However, in this example, for the computing device 50 to access the memory 104 of the storage system, it needs to take over the role as the host. To do this, the controller 102 of the storage system 300 can send an instruction to the computing device 50 to take over as the host. This can be implemented in any suitable way. The flow diagram of FIG. 10 provides one such method. It should be noted that other methods can be used. In this example, power is connected to the storage system 300 before connecting the storage system 300 to the computing device 50, as the presence of power causes the switch 111 to change the pin configurations, which cause the computing device 50 to think it is a peripheral. Also, this example assumes that the storage system 300 is directly connected to the computing device 50, in case using a cable to indirectly connect the storage system 300 to the computed device 50 may not trick the computing device 50 into thinking it is a peripheral. However, other arrangements are possible.

As shown in FIG. 10, after the storage system 300 is connected to the computing device 50, the storage system 100 sends the computing device 50 information identifying itself (1005) and provides power (1010). This causes the computing device 50 to think it is a peripheral and that the storage system 300 is the host. As part of this, the driver 600 in the storage system 300 sends a request for capabilities to the computing device (1015), and the computing device 50 provides those capabilities in response (1020). In this way, the controller 102 of the storage system 300 can enumerate the computing device's endpoints and can communicate to one of the endpoints where the app 55 is linked.

Once all initializations are completed, the storage system 300 instructs the computing device 50 to take over as host (1025). This request is sent to the app 55 running on the computing device 50, and the app 55 initiates the role change on the computing device by sending a request to the operating system kernel 54 (1030). In this example, the operating system kernel 54 uses a host negotiation protocol (HNP) to switch roles (1035). The driver 53 in the computing device 100 sends a request to the storage system 300 asking if it is ok to switch roles (1040), and the storage system 300 accepts the request (1045). With the computing device 50 now serving as the host, the computing device 50 sends a request for capabilities to the storage system 300 (1050), and the computing device 50 provides those capabilities in response (1065). In this way, the role reversal allows the computing device 50 to detect and bring up the storage system's functionality. The computing device 50 can then send read/write requests to the storage system 300 (1060), in response to which the controller 102 accesses the memory 104 (1065). Even though the computing device 50 has taken over the role as host, VBUS (power) is still supplied by the actual host (A-Device) which is the storage system 100. In this way, the storage system 100 simultaneously provides power and memory access to the computing device 50.

There are several alternatives that can be used with these embodiments. For example, in one alternate embodiment, the storage system 300 is used as a data transfer cable for connecting the computing device 50 to another computing device (e.g., a personal computer). In this way, the user does not need to worry about carrying a data cable to connect the computing device 50 to a personal computer. Further, because the storage system 300 can act as a hub, the second connector 320 provides an open connector to the computing device 50 for use with other peripherals, such as, but not limited to, headphones, a keyboard, a mouse, and even another storage system. Additionally, when the second connector 320 is connected to a personal computer or other computing device that itself has open ports, those open ports can be used for additionally connectivity (e.g., plugging in headphones into the headphone power of a personal computer, so a user can watch a movie stored on the storage system 300 via his computing device 50 and listen to the movie via headphones plugged into the personal computer).

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A storage system, comprising:
    a memory;
    a first connector;
    a second connector; and
    a controller configured to:
        represent the storage system as a host to a computing device connected to the first connector; then
        provide power received from the second connector to the computing device via the first connector; then
        instruct the computing device to take over as the host, wherein power is still provided to the computing device via the first connector after the computing device takes over as the host; and then
        allow the computing device to access the memory via the first connector while still providing the computing device with power via the first connector.

2. The storage system of claim 1, wherein the first connector is a micro universal serial bus connector, and wherein the controller is further configured to represent the storage system as the host to the computing device by grounding an identification (ID) pin of the first connector.

3. The storage system of claim 1, wherein the first connector is a Type-C universal serial bus connector, and wherein the controller is further configured to represent the storage system as the host to the computing device by switching channel configuration (CC) pins of the first connector to high through a pull-up resistor (Rp).

4. The storage system of claim 1, wherein the computing device takes over as the host using a host negotiation protocol.

5. The storage system of claim 1, wherein the memory comprises a three-dimensional memory.

6. The storage system of claim 1, wherein the first connector is configured to be removably connected with the computing device, and wherein the second connector is configured to be removable connected with a power source.

7. The storage system of claim 1, wherein one of the first connector and the second connector is a universal serial bus connector, and wherein the other of the first connector and the second connector is a micro universal serial bus connector.

8. A method comprising:
performing the following in a storage system comprising a memory, a first connector, and a second connector:
instructing a computing device connected to the storage system via the first connector that the storage system is a host; then
providing power received via the second connector to the computing device via the first connector; then
instructing the computing device to take over as the host, wherein power is still provided to the computing device via the first connector after the computing device takes over as the host; and then
allowing the computing device to access the memory via the first connector while still providing the computing device with power via the first connector.

9. The method of claim 8, wherein the first connector is a micro universal serial bus connector, and wherein the storage system instructs the computing device that the storage system is the host by grounding an identification (ID) pin of the first connector.

10. The method of claim 8, wherein the first connector is a Type-C universal serial bus connector, and wherein the storage system instructs the computing device that the storage system is the host by switching channel configuration (CC) pins of the first connector to high through a pull-up resistor (Rp).

11. The method of claim 8, wherein the computing device takes over as the host using a host negotiation protocol.

12. The method of claim 8, wherein the memory comprises a three-dimensional memory.

13. The method of claim 8, wherein the first connector is configured to be removably connected with the computing device, and wherein the second connector is configured to be removable connected with a power source.

14. A storage system, comprising:
a memory;
a first connector;
a second connector;
means for representing the storage system as a host to a computing device connected to the first connector;
means for providing power received from the second connector to the computing device via the first connector;
means for instructing the computing device to take over as the host, wherein power is still provided to the computing device via the first connector after the computing device takes over as the host; and
means for allowing the computing device to access the memory via the first connector while still providing the computing device with power via the first connector.

15. The storage system of claim 1, wherein the first and second connectors are the only connectors of the storage system.

16. The method of claim 8, wherein the first and second connectors are the only connectors of the storage system.

17. The storage system of claim 14, wherein the first and second connectors are the only connectors of the storage system.

18. The storage system of claim 1, wherein the first and second connectors are both male connectors and are positioned on opposite ends of the storage system.

19. The method of claim 8, wherein the first and second connectors are both male connectors and are positioned on opposite ends of the storage system.

20. The storage system of claim 14, wherein the first and second connectors are both male connectors and are positioned on opposite ends of the storage system.

* * * * *